(12) United States Patent
Song (10) Patent No.: US 7,755,393 B1
(45) Date of Patent: Jul. 13, 2010

(54) OUTPUT DRIVER FOR USE IN SEMICONDUCTOR DEVICE

(75) Inventor: Seong-Hwi Song, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/487,290

(22) Filed: Jun. 18, 2009

(30) Foreign Application Priority Data

Dec. 26, 2008 (KR) ................... 10-2008-0134919

(51) Int. Cl.
*H03K 19/0185* (2006.01)
*H03K 19/0175* (2006.01)

(52) U.S. Cl. .................. 326/80; 326/81; 326/68; 327/333

(58) Field of Classification Search .......... 326/63, 326/68, 80, 81, 83; 327/333
See application file for complete search history.

(56) References Cited

U.S. PATENT DOCUMENTS

| | | | |
|---|---|---|---|
| 5,204,557 A * | 4/1993 | Nguyen | 326/81 |
| 7,355,445 B2 * | 4/2008 | Kimura | 326/81 |
| 7,362,128 B2 | 4/2008 | Choi et al. | |
| 7,484,064 B2 | 1/2009 | Ware et al. | |
| 2008/0034378 A1 | 2/2008 | Kumar et al. | |
| 2009/0115448 A1 | 5/2009 | Abadeer et al. | |

FOREIGN PATENT DOCUMENTS

JP    2003-218958    7/2003

* cited by examiner

*Primary Examiner*—Daniel D Chang
(74) *Attorney, Agent, or Firm*—IP & T Law Firm PLC (57) ABSTRACT

An output driver for use in a semiconductor device includes a first pre-drive unit, a second pre-drive unit, and a main drive unit. The first pre-drive unit generates a pull-up drive control signal based on a data signal. The pull-up drive control signal swings between a power supply voltage level and a low voltage level. The data signal swings between the power supply voltage level and a ground voltage level. The second pre-drive unit generates a pull-down drive control signal based on the data signal. The pull-down drive control signal swings between a high voltage level and the ground voltage level. The main drive unit performs pull-up/down drive operations to an output terminal in response to the pull-up/down drive control signals, respectively. Herein, the high voltage level is higher than the power supply voltage level and the low voltage level is lower than the ground voltage level.

29 Claims, 6 Drawing Sheets

OUTPUT DRIVER FOR USE IN SEMICONDUCTOR DEVICE

CROSS-REFERENCE TO RELATED APPLICATION

The present invention claims priority of Korean patent application number 10-2008-0134919, filed on Dec. 26, 2008, the disclosure of which is incorporated herein by reference in its entirety.

BACKGROUND OF THE INVENTION

The present invention relates to an output driver for use in a semiconductor device, and more particularly, to an output driver effectively performing an impedance matching operation.

An output driver is a circuit for driving an output pad to which a predetermined load is connected in order to output a data from a semiconductor device. Generally, a push-pull type driver is widely used as the output driver. The push-pull type driver has a form of a CMOS inverter constituted with a pull-up PMOS transistor and a pull-down NMOS transistor serially connected each other between a power supply voltage VDD terminal and a ground voltage VSS terminal.

Figure 1:
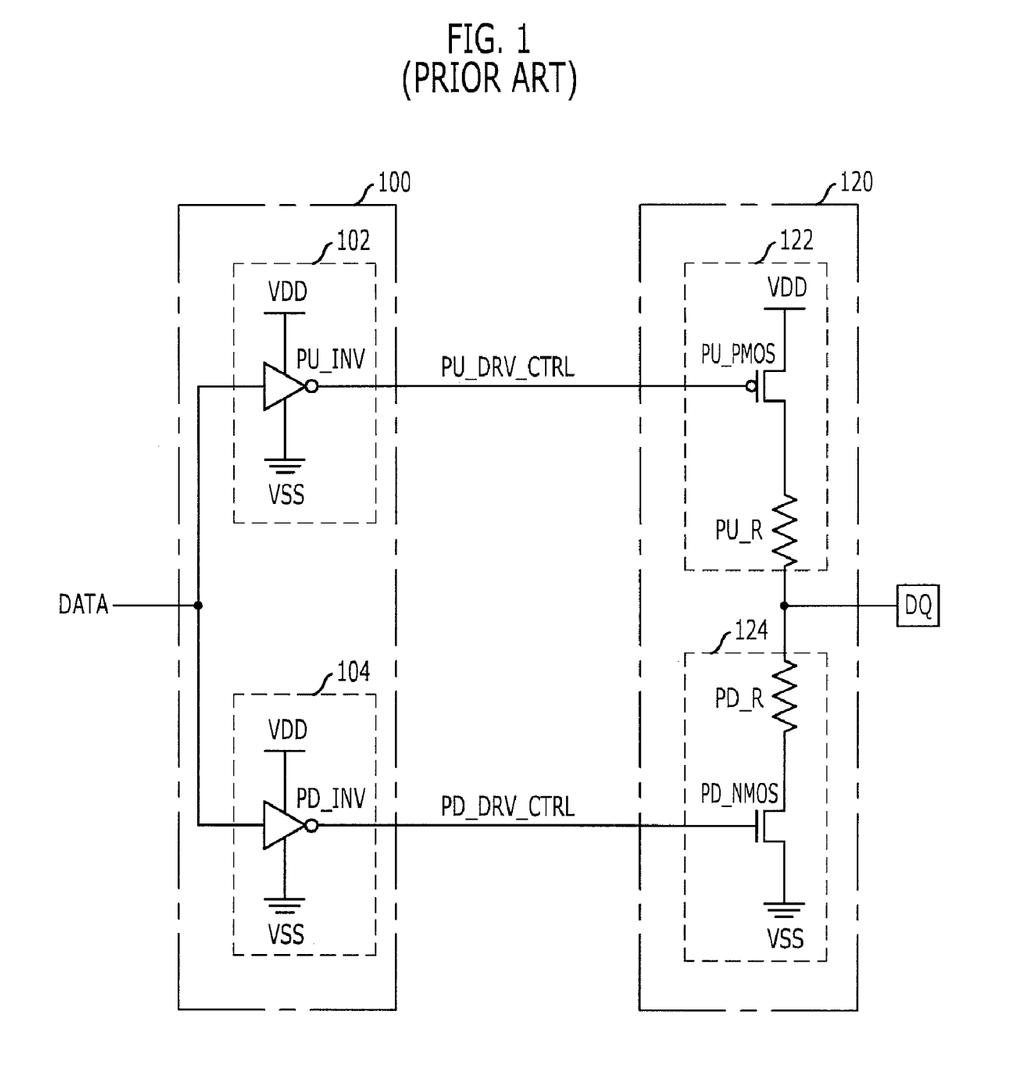
FIG. 1 is a detailed circuit diagram illustrating a conventional output driver.

FIG. 1 is a detailed circuit diagram illustrating a conventional output driver.

Referring FIG. 1, the conventional output driver includes a pre-drive unit 100 and a main drive unit 120. The pre-drive unit 100 generates drive control signals PU_DRV_CTRL and PD_DRV_CTRL based on a data signal DATA. The main drive unit 120 drives an output terminal DQ in response to the control signals PU_DRV_CTRL and PD_DRV_CTRL.

The pre-drive unit 100 includes a pull-up pre-drive unit 102 and a pull-down pre-drive unit 104. The pull-up pre-drive unit 102 generates the pull-up drive control signal PU_DRV_CTRL; and the pull-down pre-drive unit 104 generates the pull-down drive control signal PD_DRV_CTRL. The pull-up pre-drive unit 102 includes a pull-up inverter PU_INV for inverting the data signal DATA by using a power supply voltage VDD and a ground voltage VSS and outputting the pull-up drive control signal PU_DRV_CTRL. The pull-down pre-drive unit 104 includes a pull-down inverter PD_INV for inverting the data signal DATA by using the power supply voltage VDD and the ground voltage VSS and outputting the pull-down drive control signal PD_DRV_CTRL.

The main drive unit 120 includes a pull-up main drive unit 122 and a pull-down main drive unit 124. The pull-up main drive unit 122 performs a pull-up drive operation to the output terminal DQ in response to the pull-up drive control signal PU_DRV_CTRL outputted from the pull-up pre-drive unit 102. The pull-down main drive unit 124 performs a pull-down drive operation to the output terminal DQ in response to the pull-down drive control signal PD_DRV_CTRL outputted from the pull-down pre-drive unit 104. The pull-up main drive unit 122 includes a pull-up PMOS transistor PU_PMOS and a pull-up resistor PU_R. The pull-up PMOS transistor PU_PMOS, connected between a power supply voltage VDD terminal and the pull-up resistor PU_R, receives the pull-up drive control signal PU_DRV_CTRL through its gate. The pull-up PMOS transistor PU_PMOS is connected to the output terminal DQ through the pull-up resistor PU_R. The pull-down main drive unit 124 includes a pull-down NMOS transistor PD_NMOS and a pull-down resistor PD_R.

The pull-down NMOS transistor PD_NMOS, connected between a ground voltage VSS terminal and the pull-down resistor PD_R, receives the pull-down drive control signal PD_DRV_CTRL through its gate. The pull-down NMOS transistor PD_NMOS is connected to the output terminal DQ through the pull-down resistor PD_R.

Hereinafter, an operation of the output driver with above-mentioned structure will be described.

Firstly, in case that the data signal DATA has a logic high level of a power supply voltage VDD level, the pull-up pre-drive unit 102 inverts the data signal DATA and outputs the pull-up drive control signal PU_DRV_CTRL of a logic low level corresponding to a ground voltage VSS level. The pull-down pre-drive unit 104, also, inverts the data signal DATA and outputs the pull-down drive control signal PD_DRV_CTRL of the logic low level corresponding to the ground voltage VSS level. The pull-up PMOS transistor PU_PMOS in the pull-up main drive unit 122 is turned on in response to the pull-up drive control signal PU_DRV_CTRL of the logic low level and provides the output terminal DQ with the power supply voltage VDD. However, the pull-down NMOS transistor PD_NMOS receiving the pull-down drive control signal PD_DRV_CTRL of the logic low level is turned off and cannot provide the output terminal DQ with the ground voltage VSS. Therefore, the output terminal DQ has the logic high level of the power supply voltage VDD level when the data signal DATA is the logic high level.

Next, in case that the data signal DATA has a logic low level of the ground voltage VSS level, the pull-up pre-drive unit 102 inverts the data signal DATA and outputs the pull-up drive control signal PU_DRV_CTRL of the logic high level corresponding to the power supply voltage VDD level. The pull-down pre-drive unit 104, also, inverts the data signal DATA and outputs the pull-down drive control signal PD_DRV_CTRL of the logic high level corresponding to the power supply voltage VDD level. The pull-up PMOS transistor PU_PMOS receiving the pull-up drive control signal PU_DRV_CTRL of the logic high level is turned off. The pull-down NMOS transistor PD_NMOS is turned on in response to the pull-down drive control signal PD_DRV_CTRL of the logic high level and provides the output terminal DQ with the ground voltage VSS. Therefore, the output terminal DQ has the logic low level of the ground voltage VSS level when the data signal DATA is the logic low level.

Meanwhile, the pull-up resistor PU_R and the pull-down resistor PD_R are passive elements and their resistances are fixed without concerning the state of the control signals. However, by being connected between the pull-up PMOS transistor PU_PMOS and the output terminal DQ and between the pull-down NMOS transistor PD_NMOS and the output terminal DQ, respectively, the pull-up resistor PU_R and the pull-down resistor PD_R make an output signal, outputted through the output terminal DQ, linearly changed. That is, the pull-up resistor PU_R and the pull-down resistor PD_R are used for impedance matching with an output terminal to which the output signal is transmitted. For example, the resistance of the output terminal DQ of the DDR3 SDRAM is defined as "34Ω±10%" in the Specification for the reliable data transmission. In other words, if the resistance of the output terminal DQ of the DDR3 SDRAM is out of the range of "34Ω±10%", the reliable data transmission cannot be ensured.

The resistance of the output terminal DQ is determined not only by the pull-up resistor PU_R and the pull-down resistor PD_R but also by the pull-up PMOS transistor PU_PMOS and the pull-down NMOS transistor PD_NMOS. When the pull-up PMOS transistor PU_PMOS and the pull-down NMOS transistor PD_NMOS are turned on, the pull-up PMOS transistor PU_PMOS and the pull-down NMOS transistor PD_NMOS affects to the resistance of the output terminal. Therefore, the total resistance of the output terminal DQ is determined by adding the resistance of the pull-up PMOS transistor PU_PMOS and the pull-down NMOS transistor PD_NMOS, which are turned on, to the resistance of the pull-up resistor PU_R and the pull-down resistor PD_R.

Figure 2A:
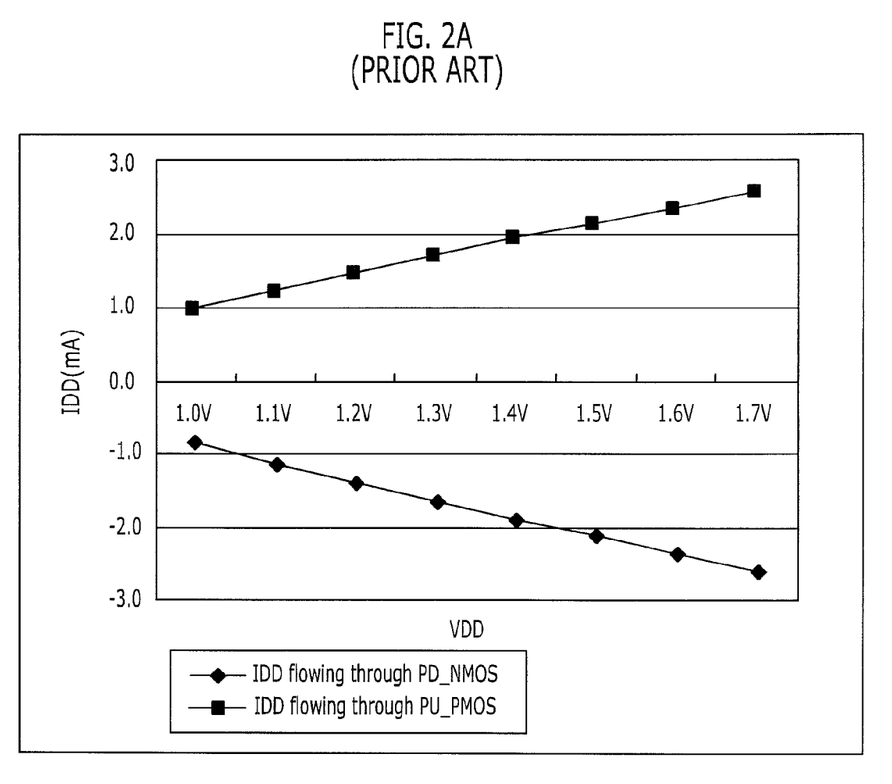
FIG. 2A is a waveform diagram illustrating the current amount flowing through the pull-up PMOS transistor and the pull-down NMOS transistor shown in FIG. 1 according to the power supply voltage level.

FIG. 2A is a waveform diagram illustrating the current amount flowing through the pull-up PMOS transistor PU_PMOS and the pull-down NMOS transistor PD_NMOS according to the power supply voltage VDD level.

Referring to FIG. 2A, when the power supply voltage VDD level decreases from about 1.7V to about 1.0V, the absolute value of the current amount IDD flowing through the pull-up PMOS transistor PU_PMOS and the pull-down NMOS transistor PD_NMOS decreases from about 2.5 mA to 1.0 mA. The decrease of the current amount IDD means that the resistances of the pull-up PMOS transistor PU_PMOS and the pull-down NMOS transistor PD_NMOS increase as the power supply voltage VDD level decreases.

Figure 2B:
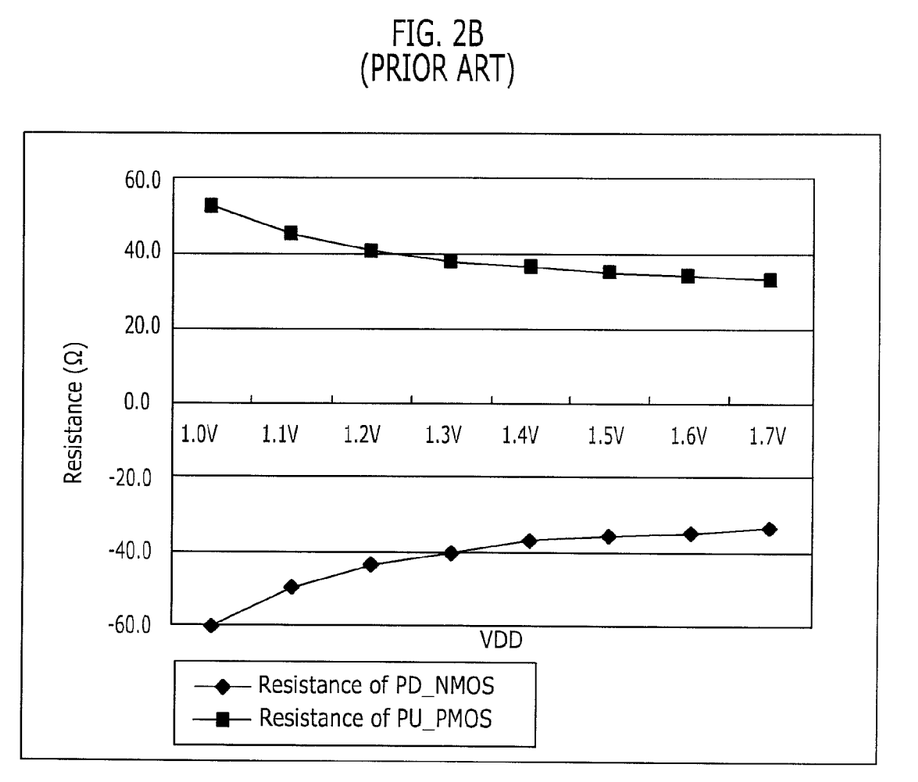
FIG. 2B is a waveform diagram illustrating the resistances of the pull-up PMOS transistor and the pull-down NMOS transistor shown in FIG. 1 according to the power supply voltage level.

FIG. 2B is a waveform diagram illustrating the resistances of the pull-up PMOS transistor PU_PMOS and the pull-down NMOS transistor PD_NMOS according to the power supply voltage VDD level.

Referring to FIG. 2B, when the power supply voltage VDD level decreases from about 1.7V to about 1.0V, the absolute value of the resistances of the pull-up PMOS transistor PU_PMOS and the pull-down NMOS transistor PD_NMOS dramatically increase from about 33Ω to about 50Ω.

The data shown in FIGS. 2A and 2B are the result when the output driver shown in FIG. 1 is applied to the DDR3 SDRAM.

As a result, the current amount IDD flowing through the pull-up PMOS transistor PU_PMOS and the pull-down NMOS transistor PD_NMOS decrease and the resistances of the pull-up PMOS transistor PU_PMOS and the pull-down NMOS transistor PD_NMOS increases as the power supply voltage VDD level decreases. That is, the distribution of the resistances of the pull-up PMOS transistor PU_PMOS and the pull-down NMOS transistor PD_NMOS are out of the range of "34Ω±10%", and, therefore, the conventional output driver shown in FIG. 1 is hardly possible to match the impedance between the output terminal and the input terminal to which the output signal is transmitted. For example, although the resistance of the output terminal DQ is adjusted to about 35Ω based on the power supply voltage VDD level of about 1.5V, the resistance of the output terminal DQ easily changes to about 60Ω when the power supply voltage VDD level decreases to about 1.0V. Therefore, it is meaningless to adjust the resistances of the pull-up resistor PU_R and the pull-down resistor PD_R for the impedance matching operation based on the power supply voltage VDD level of 1.5V. As mentioned above, the conventional output driver cannot ensure a reliable data transmission because of the radical change of the resistances of the pull-up PMOS transistor PU_PMOS and the pull-down NMOS transistor PD_NMOS in the main drive unit 120.

SUMMARY OF THE INVENTION

Embodiments of the present invention are directed to an output driver for use in a semiconductor device effectively performing an impedance matching operation without concerning the power supply voltage level.

In accordance with an aspect of the present invention, there is provided an output driver for use in a semiconductor device, including a first pre-drive unit, a second pre-drive unit, and a main drive unit. The first pre-drive unit generates a pull-up drive control signal based on a data signal. The pull-up drive control signal swings between a power supply voltage level and a low voltage level. The data signal swings between the power supply voltage level and a ground voltage level. The second pre-drive unit generates a pull-down drive control signal based on the data signal. The pull-down drive control signal swings between a high voltage level and the ground voltage level. The main drive unit performs pull-up/down drive operations to an output terminal in response to the pull-up drive control signal and the pull-down drive control signal, respectively. Herein, the high voltage level is higher than the power supply voltage level and the low voltage level is lower than the ground voltage level.

In accordance with another aspect of the present invention, there is provided an output driver for use in a semiconductor memory device including a pre-drive unit, a first level shift unit, a second level shift unit, and a main drive unit. The pre-drive unit generates pull-up/down drive control signals based on a data signal swinging between a power supply voltage level and a ground voltage level. The first level shift unit shifts the lowest level of the pull-up drive control signal to a low voltage level. The second level shift unit shifts the highest level of the pull-down drive control signal to a high voltage level. The main drive unit performs pull-up/down drive operations to an output terminal in response to the pull-up drive control signal and the pull-down drive control signal, respectively. Herein, the high voltage level is higher than the power supply voltage level and the low voltage level is lower than the ground voltage level.

DESCRIPTION OF SPECIFIC EMBODIMENTS

Other objects and advantages of the present invention can be understood by the following description, and become apparent with reference to the embodiments of the present invention.

Hereinafter, an output driver for use in a semiconductor device in accordance with an embodiment of the present invention will be described in detail.

Figure 3:
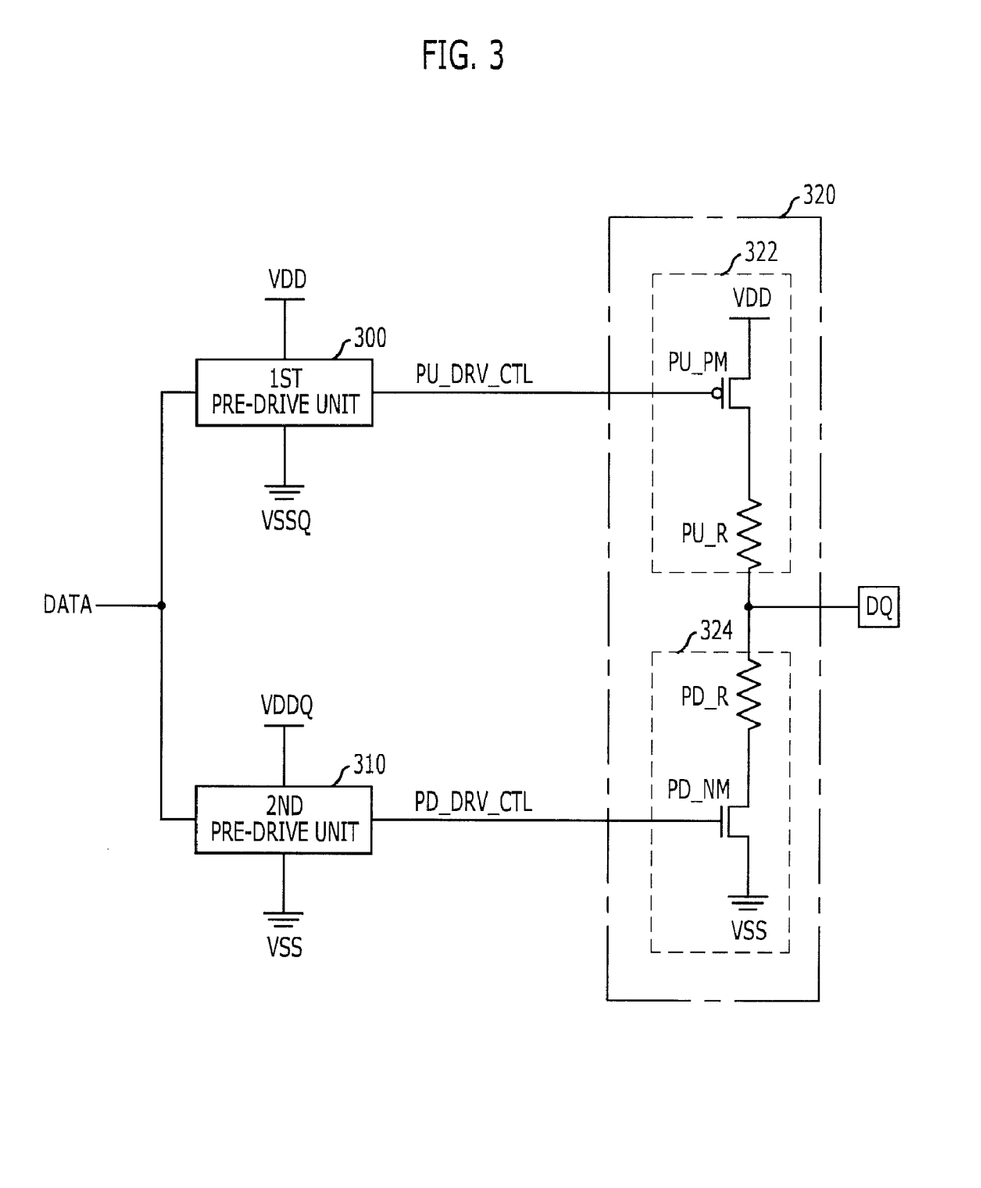
FIG. 3 is a block diagram illustrating an output driver for use in a semiconductor device in accordance with an embodiment of the present invention.

FIG. 3 is a block diagram illustrating an output driver for use in a semiconductor device in accordance with an embodiment of the present invention.

Referring to FIG. 3, the output driver includes a first pre-drive unit 300, a second pre-drive unit 310, and a main drive unit 320.

The first pre-drive unit 300 receives a data signal DATA swinging between a power supply voltage VDD level and a ground voltage VSS level. Then, the first pre-drive unit 300 generates a pull-up drive control signal PU_DRV_CTL, swinging between the power supply VDD voltage level and a low voltage VBBQ level based on the data signal DATA. Herein, the low voltage VBBQ level is lower than the ground voltage VSS level. The second pre-drive unit 310 generates a pull-down drive control signal PD_DRV_CTL, swinging between a high voltage VDDQ level and the ground voltage VSS level, based on the data signal DATA. Herein, the high voltage VDDQ level is higher than the power supply voltage VDD level. The main drive unit 320 performs pull-up/down drive operations to an output terminal DQ in response to the pull-up drive control signal PU_DRV_CTL and the pull-down drive control signal PD_DRV_CTL, respectively.

Comparing with the conventional output driver shown in FIG. 1, the output driver of the present invention uses the low voltage VBBQ and the high voltage VDDQ instead of the ground voltage VSS and the power supply voltage VDD, respectively. In detail, the first pre-drive unit 300 generates the pull-up drive control signal PU_DRV_CTL by using the low voltage VBBQ instead of the ground voltage VSS; and the second pre-drive unit 310 generates the pull-down drive control signal PD_DRV_CTL by using the high voltage VDDQ instead of the power supply voltage VDD. The low voltage VBBQ can be generated based on the ground voltage VSS inside of the first pre-drive unit 300 or can be generated in an external circuit and, then, inputted to the first pre-drive unit 300. Also, the high voltage VDDQ can be generated by using the power supply voltage VDD inside of the second pre-drive unit 310 or can be generated in an external circuit and, then, inputted to the second pre-drive unit 310.

In case that the low voltage VBBQ and the high voltage VDDQ are externally generated and inputted to the first and the second pre-drive units 300 and 310, the first pre-drive unit 300 drives the pull-up drive control signal PU_DRV_CTL by using the power supply voltage VDD and the low voltage VBBQ; and the second pre-drive unit 310 drives the pull-down drive control signal PD_DRV_CTL by using the high voltage VDDQ and the ground voltage VSS. In detail, in case that the data signal DATA has the power supply voltage VDD level, the first pre-drive unit 300 drives the pull-up drive control signal PU_DRV_CTL with the low voltage VBBQ; and the second pre-drive unit 310 drives the pull-down drive control signal PD_DRV_CTL with the ground voltage VSS. In case that the data signal DATA has the ground voltage VSS level, the first pre-drive unit 300 drives the pull-up drive control signal PU_CRV_CTL with the power supply voltage VDD; and the second pre-drive unit 310 drives the pull-down drive control signal PD_DRV_CTL with the high voltage VDDQ.

The operation of the first and the second pre-drive units 300 and 310 in case that the low voltage VBBQ and the high voltage VDDQ are internally generated will be particularly described below with incorporation of the drawings.

The main drive unit 320 includes a pull-up main drive unit 322 and a pull-down main drive unit 324. The pull-up main drive unit 322 performs a pull-up drive operation to the output terminal DQ in response to the pull-up drive control signal PU_DRV_CTL. The pull-down main drive unit 324 performs a pull-down drive operation to the output terminal DQ in response to the pull-down drive control signal PD_DRV_CTL.

The pull-up main drive unit 322 includes a pull-up PMOS transistor PU_PM and a pull-up resistor PU_R. The pull-up PMOS transistor PU_PM, connected between a power supply voltage VDD terminal and the pull-up resistor PU_R, receives the pull-up drive control signal PU_DRV_CTL through its gate. The pull-up PMOS transistor PU_PM is coupled to the output terminal DQ through the pull-up resistor PU_R. The pull-down main drive unit 324 includes a pull-down NMOS transistor PD_NM and a pull-down resistor PD_R. The pull-down NMOS transistor PD_NM, connected between a ground voltage VSS terminal and the pull-down resistor PD_R, receives the pull-down drive control signal PD_DRV_CTL through its gate. The pull-down NMOS transistor PD_NM is coupled to the output terminal DQ through the pull-down resistor PD_R.

Although it is not described in the drawings, a variable pull-up resistor can be included in the pull-up main drive unit 322 instead of the pull-up PMOS transistor PU_PM; and a variable pull-down resistor can be included in the pull-down main drive unit 324 instead of the pull-down NMOS transistor PD_NM in another embodiment of the present invention.

Hereinafter, an operation of the output driver will be described.

Firstly, in case that the data signal DATA has a logic high level of a power supply voltage VDD level, the first pre-drive unit 300 outputs the pull-up drive control signal PU_DRV_CTL of a logic low level corresponding to the low voltage VBBQ level. The second pre-drive unit 310 outputs the pull-down drive control signal PD_DRV_CTL of the logic low level corresponding to the ground voltage VSS level.

Although both of the pull-up drive control signal PU_DRV_CTL and the pull-down drive control signal PD_DRV_CTL commonly have the logic low level, the pull-down drive control signal PD_DRV_CTL has the ground voltage VSS level and, however, the pull-up drive control signal PU_DRV_CTL has the low voltage VBBQ level. The pull-up drive control signal PU_DRV_CTL of the low voltage VBBQ level is inputted to the pull-up PMOS transistor PU_PM and turns on the pull-up PMOS transistor PU_PM. Therefore, the power supply voltage VDD is supplied to the output terminal DQ. However, the pull-down NMOS transistor PD_NM receiving the pull-down drive control PD_DRV_CTL of the logic low level is turned off and cannot provide the output terminal DQ with the ground voltage VSS. Therefore, the output terminal DQ has the logic high level of the power supply voltage VDD level when the data signal DATA is the logic high level.

Particularly, a gate-source voltage of the pull-up PMOS transistor PU_PM has a sufficiently high level, even when the power supply voltage VDD level becomes lower, because the pull-up drive control signal PU_DRV_CTL has the low voltage VBBQ level which is lower than the ground voltage level. Thus, the power supply voltage VDD is reliably supplied to the output terminal DQ. In other words, as the power supply voltage VDD decreases, a voltage level of a source terminal of the pull-up PMOS transistor PU_PM decreases because the source terminal of the pull-up PMOS transistor PU_PM is connected to the power supply voltage VDD terminal. Thus, the gate-source voltage of the pull-up PMOS transistor PU_PM decreases and the driving power of the pull-up PMOS transistor PU_PM is reduced in general case. However, since the present invention provides a gate of the pull-up PMOS transistor PU_PM with the pull-up drive control signal PU_DRV_CTL of the low voltage VBBQ level, a voltage difference between a source and a gate of the pull-up PMOS transistor PU_PM becomes sufficient to turn on the pull-up PMOS transistor PU_PM. Therefore, the gate-source voltage of the PMOS transistor PU_PM keeps an almost stable level without concerning to the power supply voltage level and the resistance of the pull-up PMOS transistor PU_PM changes in a relatively small extent. As a result, it is possible for the output driver of the present invention to effectively perform an impedance matching operation.

Next, in case that the data signal DATA has a logic low level of the ground voltage VSS level, the first pre-drive unit 300 outputs the pull-up drive control signal PU_DRV_CTL of the logic high level corresponding to the power supply voltage VDD level. The second pre-drive unit 310 outputs the pull-down drive control signal PD_DRV_CTL of the logic high level corresponding to the high voltage VDDQ level. The pull-up drive control signal PU_DRV_CTL and the pull-down drive control signal PD_DRV_CTL commonly have the logic high level. However, the pull-up drive control signal PU_DRV_CTL has the power supply voltage VDD level; and the pull-down drive control signal PD_DRV_CTL has the high voltage VDDQ level The pull-up PMOS transistor PU_PM receiving the pull-up drive control signal PU_DRV_CTRL of the logic high level is turned off. The pull-down NMOS transistor PD_NM is turned on in response to the pull-down drive control signal PD_DRV_CTRL of the logic high level with the high voltage VDDQ level and provides the output terminal DQ with the ground voltage VSS. Therefore, the output terminal DQ has the logic low level of the ground voltage VSS level when the data signal DATA is the logic low level.

A gate-source voltage of the pull-down NMOS transistor PD_NM has a sufficiently high level, even when the power supply voltage VDD level becomes lower, because the pull-down drive control signal PD_DRV_CTL has the high voltage VDDQ level which is higher than the power supply voltage VDD level. Thus, the ground voltage VSS is reliably supplied to the output terminal DQ. In other words, although the power supply voltage VDD level decreases, a voltage difference between a source and a gate of the pull-down NMOS transistor PD_NM becomes sufficient to turn on the pull-down NMOS transistor PD_NM because the pull-down drive control signal PD_DRV_CTL inputted to a gate of the pull-down NMOS transistor PD_NM has the high voltage VDDQ level. Therefore, the gate-source voltage of the pull-down NMOS transistor PD_NM keeps an almost stable level without concerning to the power supply voltage level and the resistance of the pull-down NMOS transistor PD_NM changes in a relatively small extent. As a result, it is possible for the output driver of the present invention to effectively perform an impedance matching operation.

Figure 4A:
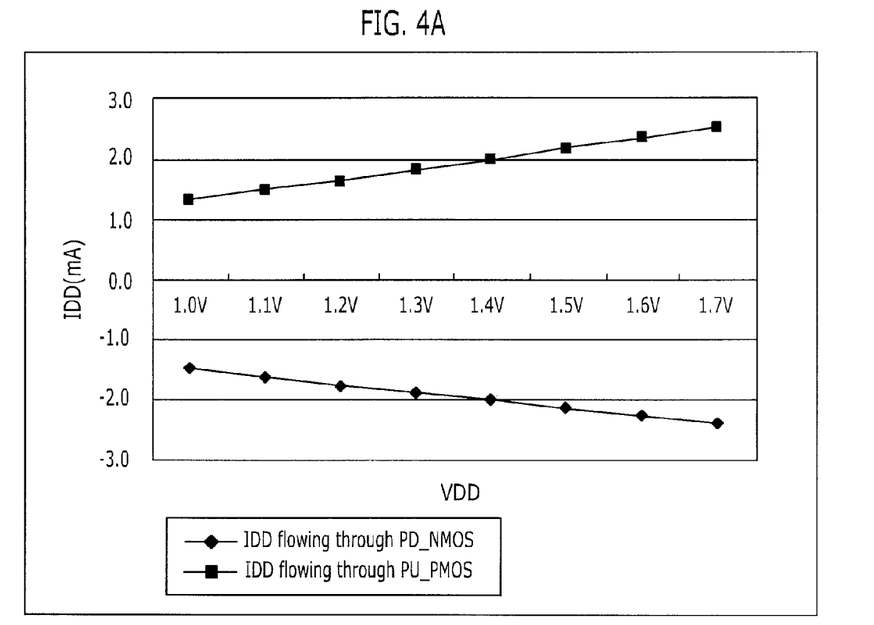
FIG. 4A is a waveform diagram illustrating the current amount flowing through the pull-up PMOS transistor and the pull-down NMOS transistor shown in FIG. 3 according to the power supply voltage level.

FIG. 4A is a waveform diagram illustrating the current amount flowing through the pull-up PMOS transistor and the pull-down NMOS transistor shown in FIG. 3 according to the power supply voltage level.

Referring to FIG. 4A, when the power supply voltage VDD level decreases from about 1.7V to about 1.0V, the absolute value of the current amount IDD flowing through the pull-up PMOS transistor PU_PM and the pull-down NMOS transistor PD_NM decreases from about 2.5 mA to 1.5 mA. Although the current amount IDD is decreased according to the decrease of the power supply voltage VDD level, the reduced current amount IDD is relatively small compared with the conventional case shown in FIG. 2A.

Figure 4B:
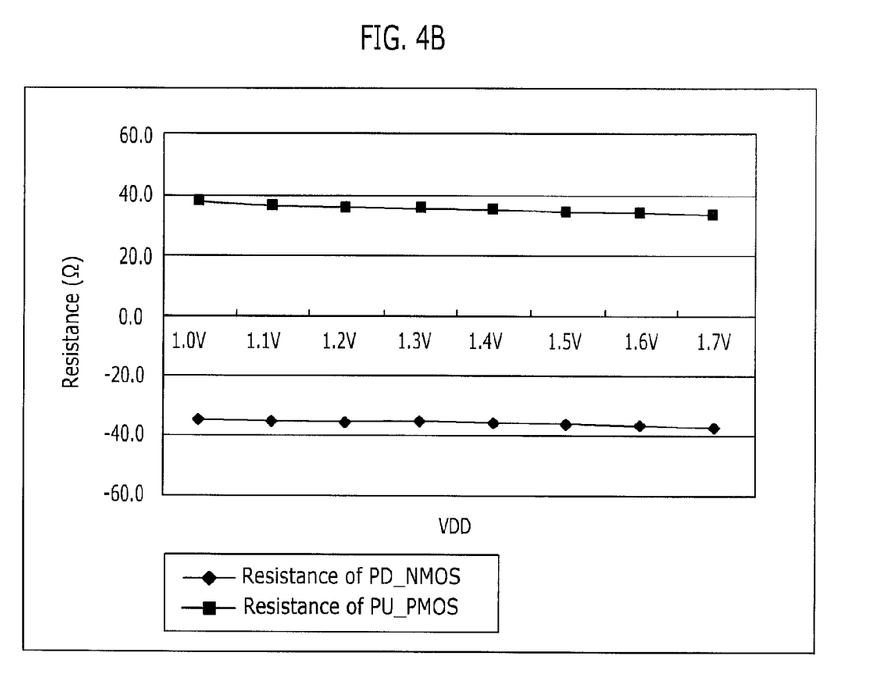
FIG. 4B is a waveform diagram illustrating the resistances of the pull-up PMOS transistor and the pull-down NMOS transistor shown in FIG. 3 according to the power supply voltage level.

FIG. 4B is a waveform diagram illustrating the resistances of the pull-up PMOS transistor PU_PM and the pull-down NMOS transistor PD_NM according to the power supply voltage VDD level.

Referring to FIG. 4B, when the power supply voltage VDD level decreases from about 1.7V to about 1.0V, the absolute value of the resistances of the pull-up PMOS transistor PU_PM and the pull-down NMOS transistor PD_NM is increased from about 33Ω, to about 37Ω. Although the resistances of the pull-up PMOS transistor PU_PM and the pull-down NMOS transistor PD_NM are not completely constant, the resistances become almost stable compared with the conventional case shown in FIG. 4B.

For the reference, the simulation result of FIGS. 4A and 4B shows the case when the output driver shown in FIG. 3 is applied to the DDR3 SDRAM. Further, the target levels of the high voltage VDDQ and the low voltage VBBQ are about 1.7V and about −0.8V, respectively. By appropriately adjusting the target levels of the high voltage VDDQ and the low voltage VBBQ, it may be possible to obtain more stable result than the case shown in FIGS. 4A and 4B.

Figure 5:
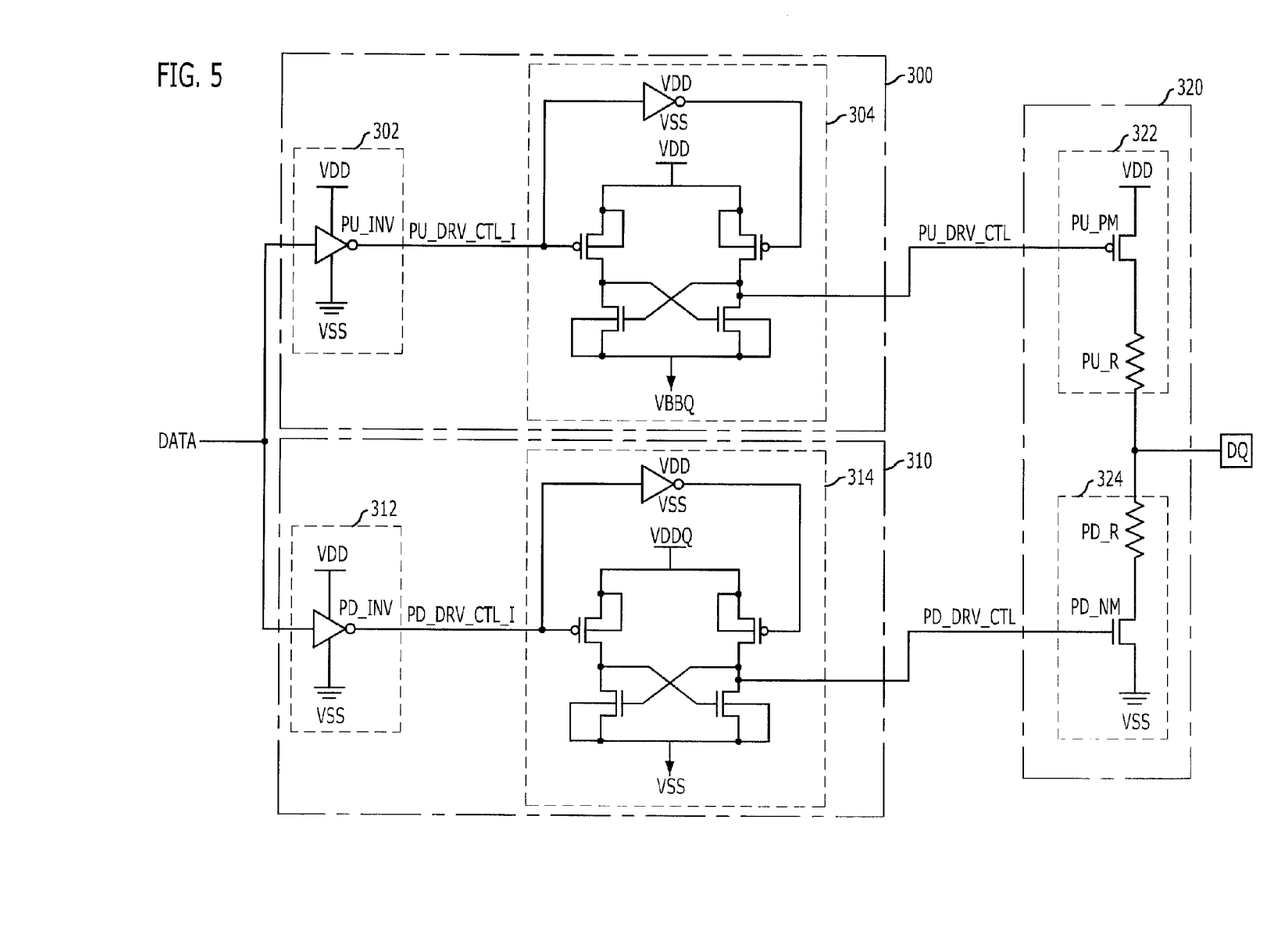
FIG. 5 is a detailed circuit diagram of the output driver shown in FIG. 3 including generation units of the high voltage and the low voltage.

FIG. 5 is a detailed circuit diagram of the output driver shown in FIG. 3 including the generation units of the high voltage VDDQ and the low voltage VBBQ.

Referring FIG. 5, the internal circuits of the first and the second pre-drive unit 300 and 310 are further depicted in detail; and the main drive unit 320 is equivalent to FIG. 3. Therefore, the detailed explanation about the structure of the main drive unit 320 will be eliminated, hereinafter, in order to avoid the unnecessary repetition.

The first pre-drive unit 300 includes a pull-up pre-drive unit 302 and a pull-up level shift unit 304. The pull-up pre-drive unit 302 generates an initial pull-up drive control signal PU_DRV_CTL_I based on the data signal DATA. The pull-up pre-drive unit 302 includes a pull-up inverter PU_INV for inverting the data signal DATA and outputting the initial pull-up drive control signal PU_DRV_CTL_I of the power supply voltage VDD level or the ground voltage VSS level. The pull-up level shift unit 304 generates the low voltage VBBQ and outputs the pull-up drive control signal PU_DRV_CTL by using the power supply voltage VDD and the low voltage VBBQ. In detail, when the initial pull-up drive control signal PU_DRV_CTL_I of the power supply voltage VDD level is inputted, the pull-up level shift unit 304 outputs the pull-up drive control signal PU_DRV_CTL of the power supply voltage VDD level. When the initial pull-up drive control signal PU_DRV_CTL_I of the ground voltage VSS level is inputted, the pull-up level shift unit 304 shifts the lowest level of the initial pull-up drive control signal PU_DRV_CTL_I to the low voltage VBBQ level and outputs the pull-up drive control signal PU_DRV_CTL of the low voltage VBBQ level. As shown in FIG. 5, the pull-up level shift unit 304 can be implemented with a charge pump widely known to those skilled in the art, and, therefore, a detailed explanation for the structure of the pull-up level shift unit 304 is eliminated for the sake of convenience.

The second pre-drive unit 310 includes a pull-down pre-drive unit 312 and pull-down level shift unit 314. The pull-down pre-drive unit 312 generates an initial pull-down drive control signal PD_DRV_CTL_I based on the data signal DATA. The pull-down pre-drive unit 312 includes a pull-down inverter PD_INV for inverting the data signal DATA and outputting the initial pull-down drive control signal PD_DRV_CTL_I of the power supply voltage VDD level or the ground voltage VSS level. The pull-down level shift unit 314 generates the high voltage VDDQ and outputs the pull-down drive control signal PD_DRV_CTL by using the high voltage VDDQ and the ground voltage VSS. In detail, when the initial pull-down drive control signal PD_DRV_CTL_I of the power supply voltage VDD level is inputted, the pull-down level shift unit 314 shifts the highest level of the initial pull-down drive control signal PD_DRV_CTL_I to the high voltage VDDQ level and outputs the pull-down drive control signal PD_DRV_CTL of the high voltage VDDQ level. When the initial pull-down drive control signal PD_DRV_CTL_I of the ground voltage VSS level is inputted, the pull-down level shift unit 314 outputs the pull-down drive control signal PD_DRV_CTL of the ground voltage VSS level. As shown in FIG. 5, the pull-down level shift unit 314 can be implemented with a charge pump widely known to those skilled in the art, and, therefore, a detailed explanation for the structure of the pull-down level shift unit 314 is eliminated for the sake of convenience.

Hereinafter, a detailed explanation of the operation of the output driver including the generation units for the high voltage VDDQ and the low voltage VBBQ according to the data signal DATA will be described.

Firstly, in case that the data signal DATA of a logic high level is inputted, the pull-up pre-drive unit 302 and the pull-down pre-drive unit 312 output the initial pull-up drive control signal PU_DRV_CTL_I and the initial pull-down drive control signal PD_DRV_CTL_I of a logic low level as the ground voltage VSS level, respectively.

The pull-up level shift unit 304, receiving the initial pull-up drive control signal PU_DRV_CTL_I of the logic low level, shifts the level of the initial pull-up drive control signal PU_DRV_CTL_I and outputs the pull-up drive control signal PU_DRV_CTL of the logic low level as the low voltage VBBQ level. The pull-down level shift unit 314, receiving the initial pull-down drive control signal PD_DRV_CTL_I of the logic low level, does not perform a level shift operation and outputs the initial pull-down drive control signal PD_DRV_CTL_I as the pull-down drive control signal PD_DRV_CTL having the ground voltage VSS level. Although both pull-up drive control signal PU_DRV_CTL and the pull-down drive control signal PD_DRV_CTL commonly have the logic low level, the pull-down drive control signal PD_DRV_CTL has the ground voltage VSS level and the pull-up drive control signal PU_DRV_CTL has the low voltage VBBQ level.

The pull-up drive control signal PU_DRV_CTL of the low voltage VBBQ level is inputted to the pull-up main drive unit 322 and turns-on the pull-up PMOS transistor PU_PM inside of the pull-up main drive unit 322. Thus, the power supply voltage VDD is supplied to the output terminal DQ. The pull-down drive control signal PD_DRV_CTL of the ground voltage VSS level is inputted to the pull-down main drive unit 324. However, the pull-down drive control signal PD_DRV_CTL of the ground voltage VSS level may not turn on the pull-down NMOS transistor PD_NM, and, therefore, the ground voltage VSS cannot be supplied to the output terminal DQ. Therefore, an output signal loaded at the output terminal DQ has the power supply voltage VDD level when the data signal DATA has the logic high level as the power supply voltage VDD level.

Particularly, a gate-source voltage of the pull-up PMOS transistor PU_PM has a sufficiently high level, even when the power supply voltage VDD level becomes lower, because the pull-up drive control signal PU_DRV_CTL has the low voltage VBBQ level which is lower than the ground voltage level. Thus, the power supply voltage VDD is reliably supplied to the output terminal DQ. Therefore, the gate-source voltage of the PMOS transistor PU_PM keeps an almost stable level without concerning to the power supply voltage level and the resistance of the pull-up PMOS transistor PU_PM changes in a relatively small extent. As a result, it may be possible for the output driver of the present invention to effectively perform an impedance matching operation.

Next, in case that the data signal DATA of a logic low level is inputted, the pull-up pre-drive unit 302 and the pull-down pre-drive unit 312 output the initial pull-up drive control signal PU_DRV_CTL_I and the initial pull-down drive control signal PD_DRV_CTL_I of a logic high level as the power supply voltage VDD level, respectively.

The pull-up level shift unit 304, receiving the initial pull-up drive control signal PU_DRV_CTL_I of the logic high level, does not perform the level shift operation and outputs the initial pull-up drive control signal PU_DRV_CTL_I as the pull-up drive control signal PU_DRV_CTL having the power supply voltage VDD level. The pull-down level shift unit 314, receiving the initial pull-down drive control signal PD_DRV_CTL_I of the logic high level, shifts the level of the initial pull-down drive control signal PD_DRV_CTL_I, and outputs the pull-down drive control signal PD_DRV_CTL of the logic high level as the high voltage VDDQ level. Although both pull-up drive control signal PU_DRV_CTL and the pull-down drive control signal PD_DRV_CTL commonly have the logic high level, the pull-down drive control signal PD_DRV_CTL has the high voltage VDDQ level and the pull-up drive control signal PU_DRV_CTL has the power supply voltage VDD level.

The pull-up drive control signal PU_DRV_CTL of the power supply voltage VDD level is inputted to the pull-up main drive unit 322. However, the pull-up drive control signal PU_DRV_CTL of the power supply voltage VDD level may not turn on the pull-up PMOS transistor PU_PM, and, therefore, the power supply voltage VDD cannot be supplied to the output terminal DQ. The pull-down drive control signal PD_DRV_CTL of the high voltage VDDQ level is inputted to the pull-down main drive unit 324 and turns-on the pull-down NMOS transistor PD_NM inside of the pull-down main drive unit 324. Thus, the ground voltage VSS is supplied to the output terminal DQ. Consequently, the output signal loaded at the output terminal DQ has the ground voltage VSS level when the data signal DATA has the logic low level as the ground voltage VSS level.

A gate-source voltage of the pull-down NMOS transistor PD_NM has a sufficiently high level, even when the power supply voltage VDD level becomes lower, because the pull-down drive control signal PD_DRV_CTL has the high voltage VDDQ level which is higher than the power supply voltage level. Thus, the ground voltage VSS is reliably supplied to the output terminal DQ. Therefore, the gate-source voltage of the NMOS transistor PD_NM keeps an almost stable level without concerning to the power supply voltage VDD level and the resistance of the pull-down NMOS transistor PD_NM changes in a relatively small extent. As a result, it may be possible for the output driver of the present invention to effectively perform an impedance matching operation.

As abovementioned, embodiments of the present invention relate to an output driver for use in a semiconductor device effectively performing an impedance matching operation without concerning the power supply voltage level. More specifically, the output driver of the present invention maintains the stable driving power of the main drive unit 320 by performing a pull-up drive operation in response to the pull-up drive control signal PU_DRV_CTL having the low voltage VBBQ level and performing a pull-down drive operation in response to the pull-down drive control signal PD_DRV_CTL having the high voltage VDDQ level. Therefore, the resistance of the output terminal DQ keeps the stable level, and it may be possible to perform the impedance matching operation reliably.

While the present invention has been described with respect to the specific embodiments, it will be apparent to those skilled in the art that various changes and modifications may be made without departing from the spirit and scope of the invention as defined in the following claims.

What is claimed is:

1. An output driver for use in a semiconductor device, comprising:
   a first pre-drive unit configured to generate a pull-up drive control signal, swinging between a power supply voltage level and a low voltage level, based on a data signal, swinging between the power supply voltage level and a ground voltage level;
   a second pre-drive unit configured to generate a pull-down drive control signal, swinging between a high voltage level and the ground voltage level, based on the data signal; and
   a main drive unit configured to perform pull-up/down drive operations to an output terminal in response to the pull-up drive control signal and the pull-down drive control signal, respectively,
   wherein the high voltage level is higher than the power supply voltage level and the low voltage level is lower than the ground voltage level.

2. The output driver of claim 1, wherein the first pre-drive unit includes:
   a unit configured to generate a low voltage by performing a negative charge pumping operation with a ground voltage; and
   a pre-drive unit configured to drive the pull-up drive control signal by using the low voltage level and the power supply voltage level in response to a logic level of the data signal.

3. The output driver of claim 1, wherein the first pre-drive unit includes a pre-drive unit configured to generate the pull-up drive control signal by driving the data signal to the power supply voltage level and the low voltage level.

4. The output driver of claim 3, wherein the low voltage is inputted from an external circuit.

5. The output driver of claim 3, wherein the low voltage is generated in an internal negative charge pumping circuit of the semiconductor.

6. The output driver of claim 1, wherein the second pre-drive unit includes
   a unit configured to generate a high voltage by performing a positive charge pumping operation with a power supply voltage; and
   a pre-drive unit configured to drive the pull-down drive control signal by using the high voltage level and the ground voltage level in response to a logic level of the data signal.

7. The output driver of claim 1, wherein the second pre-drive unit includes a pre-drive unit configured to generate the pull-down drive control signal by driving the data signal to the high voltage level and the ground voltage level.

8. The output driver of claim 7, wherein the high voltage is inputted from an external circuit.

9. The output driver of claim 7, wherein the high voltage is generated in an internal positive charge pumping circuit of the semiconductor device.

10. The output driver of claim 1, wherein the first pre-drive unit generates the pull-up drive control signal of the low voltage level when the data signal has a logic high level, and generates the pull-up drive control signal of the power supply voltage level when the data signal has a logic low level.

11. The output driver of claim 1, wherein the second pre-drive unit generates the pull-down drive control signal of the ground voltage level when the data signal has a logic high level, and generates the pull-down drive control signal of the high voltage level when the data signal has a logic low level.

12. The output driver of claim 1, wherein the main drive unit includes:
   a pull-up driver configured to perform the pull-up drive operation to the output terminal by using the power supply voltage in response to the pull-up drive control signal of the low voltage level and not to perform the pull-up drive operation to the output terminal in response to the pull-up drive control signal of the power supply voltage level.

13. The output driver of claim 1, wherein the main drive unit includes;
   a pull-down driver configured to perform the pull-down drive operation to the output terminal by using the ground voltage in response to the pull-down drive control signal of the high voltage level and not to perform the pull-down drive operation to the output terminal in response to the pull-down drive control signal of the ground voltage level.

14. The output driver of claim 1, wherein the main drive unit includes:
   a pull-up variable resistor, connected between a power supply voltage terminal and the output terminal, whose resistance is determined according to the pull-up drive control signal; and
   a pull-down variable resistor, connected between the output terminal and a ground voltage terminal, whose resistance is determined according to the pull-down drive control signal.

15. The output driver of claim 1, wherein the main drive unit includes:
   a PMOS transistor configured to control current amount flowing between a power supply voltage terminal and the output terminal in response to the pull-up drive control signal inputted through its gate; and
   a NMOS transistor configured to control current amount flowing between the output terminal and a ground voltage terminal in response to the pull-down drive control signal inputted through its gate.

16. The output driver of claim 15, wherein the main drive unit further includes:
   a pull-up resistor, connected between the PMOS transistor and the output terminal, having a predetermined resistance; and
   a pull-down resistor, connected between the output terminal and the NMOS transistor, having a predetermined resistance.

17. An output driver for use in a semiconductor memory device, comprising:
   a pre-drive unit configured to generate pull-up/down drive control signals based on a data signal swinging between a power supply voltage level and a ground voltage level;
   a first level shift unit configured to shift a lowest voltage level of the pull-up drive control signal to a low voltage level;
   a second level shift unit configured to shift a highest voltage level of the pull-down drive control signal to a high voltage level; and a main drive unit configured to perform pull-up/down drive operations to an output terminal in response to the pull-up drive control signal and the pull-down drive control signal, respectively, wherein the high voltage level is higher than the power supply voltage level and the low voltage level is lower than the ground voltage level.

18. The output driver of claim 17, wherein the pre-drive unit includes:

a pull-up pre-drive unit configured to generate the pull-up drive control signal by driving the data signal based on a power supply voltage and a ground voltage; and a pull-down pre-drive unit configured to generate the pull-down drive control signal by driving the data signal based on the power supply voltage and the ground voltage.

19. The output driver of claim 17, wherein the first level shift unit shifts the lowest voltage level of the pull-up drive control signal from the ground voltage level to the low voltage level.

20. The output driver of claim 19, wherein a low voltage is inputted from an external circuit.

21. The output driver of claim 19, wherein a low voltage is generated in an internal negative charge pumping circuit.

22. The output driver of claim 17, wherein the second level shift unit shifts the highest voltage level of the pull-down drive control signal from the power supply voltage level to the high voltage level.

23. The output driver of claim 22, wherein a high voltage is inputted from an external circuit.

24. The output driver of claim 22, wherein a high voltage is generated in an internal positive charge pumping circuit.

25. The output driver of claim 17, wherein the main drive unit includes a pull-up driver configured to perform the pull-up drive operation to the output terminal by using the power supply voltage in response to the pull-up drive control signal of the low voltage level and not to perform the pull-up drive operation to the output terminal in response to the pull-up drive control signal of the power supply voltage level.

26. The output driver of claim 17, wherein the main drive unit includes a pull-down driver configured to perform the pull-down drive operation to the output terminal by using the ground voltage in response to the pull-down drive control signal of the high voltage level and not to perform the pull-down drive operation to the output terminal in response to the pull-down drive control signal of the ground voltage level.

27. The output driver of claim 17, wherein the main drive unit includes:

a pull-up variable resistor, connected between a power supply voltage terminal and the output terminal, whose resistance is determined according to the pull-up drive control signal; and a pull-down variable resistor, connected between the output terminal and a ground voltage terminal, whose resistance is determined according to the pull-down drive control signal.

28. The output driver of claim 17, wherein the main drive unit includes:

a PMOS transistor configured to control current amount flowing between a power supply voltage terminal and the output terminal in response to the pull-up drive control signal inputted through its gate; and a NMOS transistor configured to control current amount flowing between the output terminal and a ground voltage terminal in response to the pull-down drive control signal inputted through its gate.

29. The output driver of claim 28, wherein the main drive unit further includes:

a pull-up resistor, connected between the PMOS transistor and the output terminal, having a predetermined resistance; and a pull-down resistor, connected between the output terminal and the NMOS transistor, having a predetermined resistance.

* * * * *